United States Patent
Tsuchida

[19]

[11] Patent Number: 6,036,503
[45] Date of Patent: Mar. 14, 2000

[54] IC SOCKET FOR A BGA PACKAGE

[75] Inventor: Keiji Tsuchida, Tokyo, Japan

[73] Assignee: Advantest Corporation, Tokyo, Japan

[21] Appl. No.: 08/963,859

[22] Filed: Nov. 4, 1997

[30] Foreign Application Priority Data

Nov. 15, 1996 [JP] Japan ................................. 8-304694

[51] Int. Cl.⁷ .................................................. H01R 9/09
[52] U.S. Cl. ................................ 439/70; 439/266; 439/66
[58] Field of Search ................................ 439/71, 70, 66, 439/59, 140, 141, 266

[56] References Cited

U.S. PATENT DOCUMENTS

| | | | |
|---|---|---|---|
| 5,388,998 | 2/1995 | Grange et al. | 439/66 |
| 5,518,410 | 5/1996 | Masami | 439/71 |
| 5,570,033 | 10/1996 | Staab | 324/761 |
| 5,727,954 | 3/1998 | Kato et al. | 439/66 |
| 5,791,914 | 8/1998 | Loranger et al. | 439/71 |
| 5,800,194 | 9/1998 | Yamagishi | 439/266 |

FOREIGN PATENT DOCUMENTS 10-19979  1/1998  Japan ........................... H01R 11/01

*Primary Examiner*—Khiem Nguyen
*Assistant Examiner*—Michael C. Zarroli
*Attorney, Agent, or Firm*—Oblon, Spivak, McClelland, Maier & Neustadt, P.C.

[57] ABSTRACT

A plurality of contact pins are embedded in a socket body having at least two mutually opposing parallel surfaces so as to correspond to the arrangement of a plurality of ball bumps of a BGA package. The tips of the plurality of contact pins protrude from one of the two parallel surfaces. A flat guide plate having a plurality of holes matched the arrangement and shape of the plurality of ball bumps, is elastically supported so as to be in a floating state with respect to the surface penetrated by the plurality of contact pins. And the flat guide plate houses a tip of one of the plurality of contact pins in each of the holes. The rim of the opening of each hole is in a tapered form so as to guide the center of a ball bump to within the limits of the outer form of the tip of a contact pin.

3 Claims, 5 Drawing Sheets ic SOCKET FOR A BGA PACKAGE

BACKGROUND OF THE INVENTION

1. Field of the Invention

The present invention relates to an IC socket for use in testing the performance of a semiconductor package device, and particularly to an IC socket provided with a positioning guidance structure for reliably guiding the ball bumps, which are the external terminals, of a BGA (Ball Grid Array) package to the contact pins (C/P) of an IC socket.

2. Description of the Related Art

The IC socket for a BGA package according to the prior art shown in FIG. 1 is made up of IC socket body 3 which is formed in a single block so as to have at least two mutually opposing parallel surfaces. A plurality of contact pins (C/P) 4 are embedded in this IC socket body 3 perpendicular with respect to the two mutually opposing parallel surfaces of IC socket body 3. The plurality of contact pins (C/P) 4 are arranged so as to match the positions of the ball bumps (for example, solder balls) of BGA package 1. The tip of each contact pin 4 protrudes from one of the two mutually opposing parallel surfaces of IC socket body 3. This surface is hollowed out in a bowl-shaped form at the periphery of the tip of each contact pin 4 as guide depressions 5 for ball bumps 2. In addition, the tip portion of each contact pin 4 is pressed toward the outside by a spring (not shown) inserted inside each contact pin 4. When pressed from the outside against the resilience of the springs, the tips of the contact pins 4 consequently recede into the interior of the IC socket body 3.

If the ball bumps 2 are properly aligned with the tips of the contact pins 4 in such an IC socket, the position of bumps 2 can be secured at the tips of contact pins 4 by the guide depressions 5 when the bumps 2 are pressed against the tips of contact pins 4, as shown in FIG. 2.

However, an IC socket according to the foregoing description is constructed such that the tips of contact pins 4 protrude beyond guide depressions 5, and as a result, at the time of contact, the bumps 2 of BGA package 1 come into contact with the tips of contact pins 4 before guide depressions 5 of the IC socket. Accordingly, in a case in which the centers of bumps 2 diverge from the outside (D) of contact pins 4 as shown in FIG. 3, position correction by guide depressions 5 of the IC socket is complicated and contact failures result.

SUMMARY OF THE INVENTION

The object of the present invention is to provide an IC socket that can ensure accurate contact positioning at the time of testing the performance of a BGA package device.

To achieve the above-described object, the present invention proposes an IC socket for a BGA package comprising a socket body having at least two mutually opposing parallel surfaces; a plurality of contact pins embedded in the socket body perpendicular to the two parallel surfaces and corresponding to the arrangement of a plurality of ball bumps of a BGA package such that tips of the contact pins protrude from one of the two parallel surfaces; and a flat guide plate having a plurality of holes matching the arrangement and shape of the plurality of ball bumps, elastically supported so as to be in a floating state with respect to the surface through which the plurality of contact pins protrude, and housing a tip of one of the plurality of contact pins in each of the holes; the rims of the openings of each of the holes being a tapered form so as to guide the center of each of the ball bumps to within the limits of the outer form of the tips of each of the contact pins.

Alternatively, one hole may be opened in the above-mentioned guide plate that matches the outline delineated by the outermost ball bumps of the plurality of ball bumps, and the rim of the opening of the hole may be tapered so as to guide the center of each of ball bumps to within the limits of the outer form of the tip of each of contact pins.

When the ball bumps of a BGA package are inserted into the hole of the guide plate in an IC socket according to the foregoing description, the bumps are guided by the hole toward the tips of the contact pins before making contact with the contact pins, and the centers of the bumps are thereby positioned within the limits of the outer shape of the tips of the contact pins. When the guide plate together with the BGA package is subsequently pressed toward the socket body, the bumps and the contact pins come into contact while the positions of the bump centers are held secured over the tips of the contact pins by the hole of the guide plate, thereby enabling the elimination of any contact failures.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Figure 1:
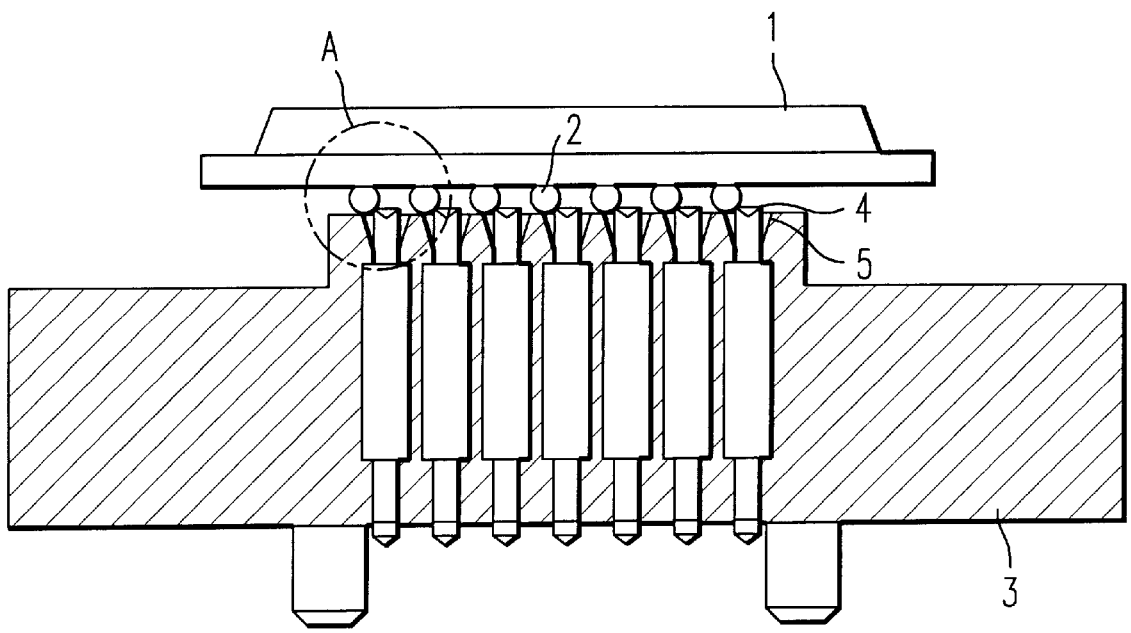
FIG. 1 is a longitudinal section showing the construction of a prior-art IC socket for a BGA package.
Figure 2:
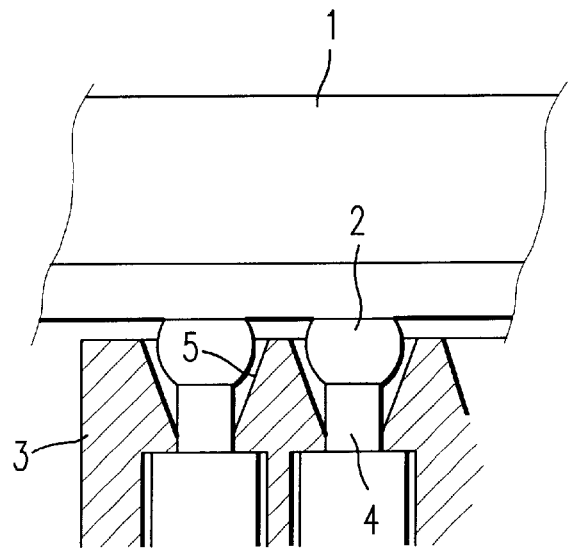
FIG. 2 is a sectional view showing the state of the prior-art IC socket when the ball bumps of a BGA package make secure contact.
Figure 3:
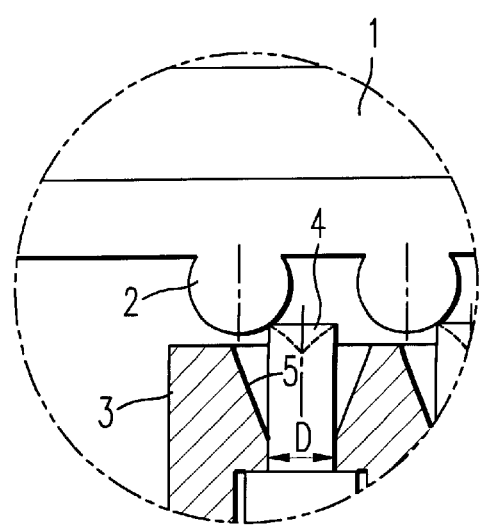
FIG. 3 is a detail of portion A shown in FIG. 1.
Figure 4:
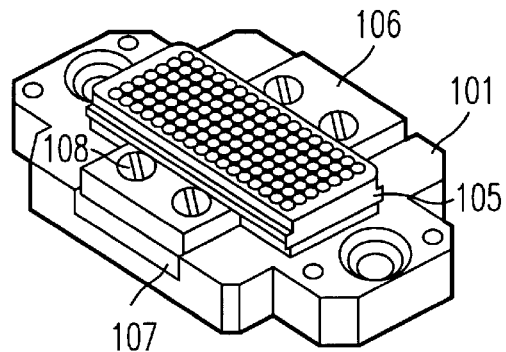
FIG. 4 is an overall perspective view of an IC socket which is one embodiment of the present invention.
Figure 5:
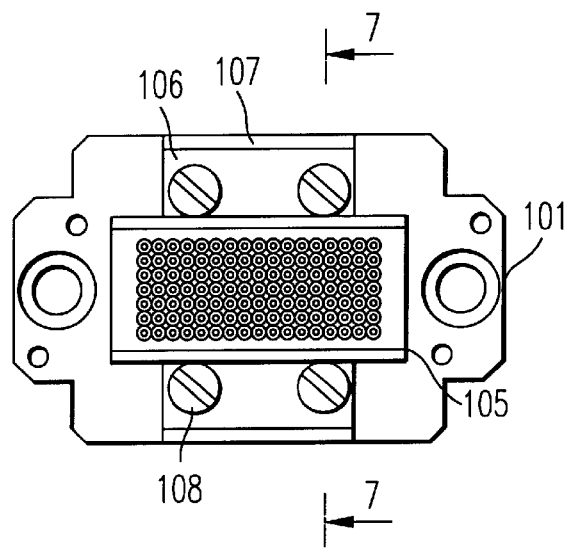
FIG. 5 is a plan view of the IC socket shown in FIG. 4.
Figure 6:
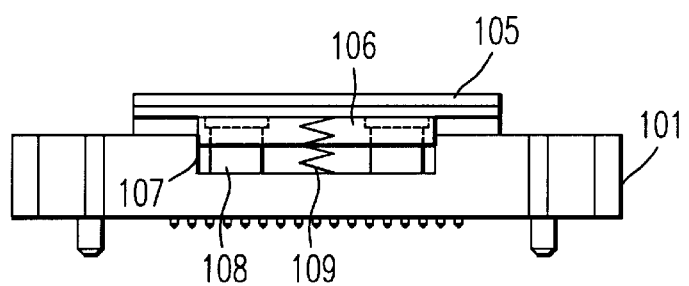
FIG. 6 is a side view of the IC socket shown in FIG. 4.
Figure 7:
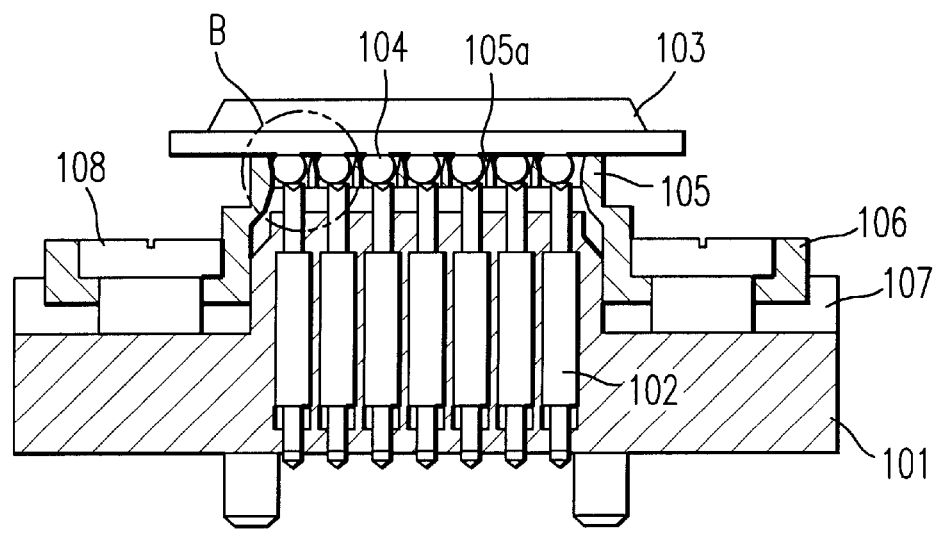
FIG. 7 is a sectional view taken along line A–A' of FIG. 5.

As shown in FIGS. 4 to 7, the IC socket of this embodiment is made up of socket body 101 formed in a single block so as to have two mutually opposing parallel surfaces. In particular, as shown in FIG. 7, a plurality of contact pins (C/P) 102 are embedded in IC socket body 101 perpendicular to the two mutually opposing parallel surfaces of IC socket body 101. Contact pins 102 are each arranged so as to correspond to the positions of ball bumps (for example, solder balls) 104 of BGA package 103. The tip of each contact pin protrudes from one of the two mutually opposing parallel surfaces of IC socket body 101. The tip of each of these contact pins 102 is elastically pressed outward by a spring (not shown) inserted inside each contact pin 102. As a result, when the tips of contact pins 102 are pressed down from the outside against the resilience of the spring (not shown), contact pins 102 recede inside IC socket body 101.

Guide plate 105 of a flat plate shape is held elastically so as to be in a floating state with respect to the surface penetrated by the plurality of contact pins 102 of IC socket body 101. A plurality of holes 105a are formed in guide plate 105. These holes 105a match the arrangement and outer form of a plurality of ball bumps 104. And each of holes 105a accommodates a tip of one of the plurality of contact pins 102. The rim of the opening of each of holes 105a is in a tapered form so as to reliably guide the center of each of ball bumps 104 to within the limits of the outer form of the tip of each of contact pins 102.

In order to support guide plate 105 in a floating state as described hereinabove, flat plate-like tabs 106 are attached to mutually opposing sides of guide plate 105 parallel to, and at a different height than, guide plate 105. The flat plate-like tabs 106 may also be integrally formed with guide plate 105.

Each tab 106 is pushed up by spring 109 (refer to FIG. 6) so as to float with respect to IC socket body 101 and is restrained at a prescribed height by the heads of screws 108 which pass through tab 106 and screw into IC socket body 101. Guide plate 105 provided with tabs 106 thus is placed in a floating state. The height of floating can be adjusted by altering screws 108.

Figure 8:
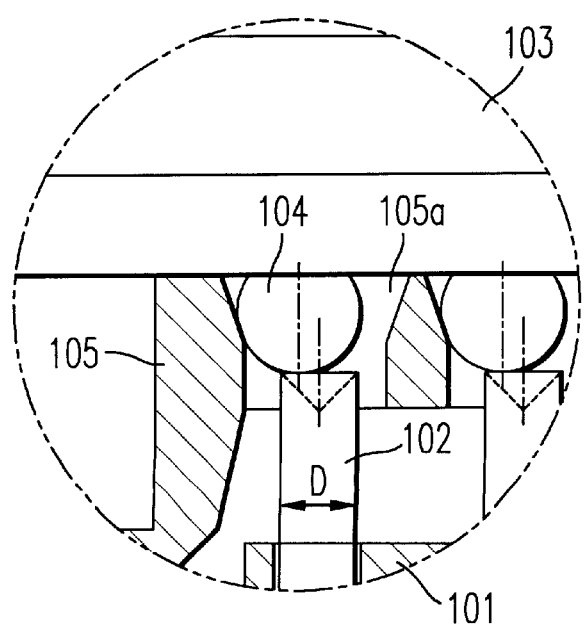
FIG. 8 is a detail of portion B of FIG. 7.

In the modification described hereinabove, when the ball bumps 104 of BGA package 103 enter holes 105a of guide plate 105, the ball bumps 104 are guided by holes 105a toward the tips of contact pins 102 before coming into contact with the contact pins 102, and the centers of ball bumps 104 are thereby positioned within the limits of the outer form (D) of the tips of contact pins 102 as shown in FIG. 8. When guide plate 105 together with BGA package 103 is subsequently pressed against IC socket body 101, ball bumps 104 and contact pins 102 come into contact while the center positions of ball bumps 104 are secured over the tips of contact pins 102 by holes 105a of guide plate 105, thereby preventing contact failures.

In this embodiment, groove 107 into which tabs 106 fit may also be formed in IC socket body 101 such that the range of movement of tabs 106 is not limited by IC socket body 101 when guide plate 105 is brought into proximity with IC socket body 101. In addition, the height of flat plate-like tabs 106 is different from that of guide plate 105 in the present modification in order that the heads of screws 108 do not hit the periphery of BGA package 103 when guide plate 105, together with BGA package 103, is moved toward IC socket body 101. However, tabs 106 and guide plate 105 may of course be at the same height if screws 108 are positioned so as not to contact BGA package 103.

Figure 9:
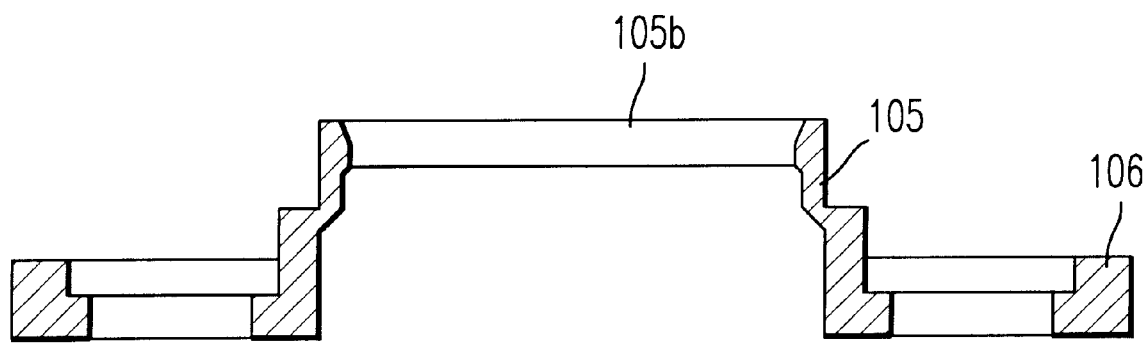
FIG. 9 is a sectional view showing another example of a guide plate in the IC socket which is an embodiment of the present invention.

Moreover, although a plurality of holes 105a are formed in guide plate 105 that match the arrangement and outer form of each of ball bumps 104 in the present embodiment, the present invention is not limited to this construction. Accordingly, one hole 105b may be opened in guide plate 105 that matches the outline delineated by the outermost ball bumps of the plurality of ball bumps 104 as shown in FIG. 9, and the rim of the opening of this hole 105b may be tapered so as to guide the center of each of ball bumps 104 to within the limits of the outer form of the tip of each of contact pins 102.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An IC socket for a BGA package comprising:
   a socket body having at least two mutually opposing parallel surfaces;
   a plurality of contact pins embedded in said socket body perpendicular to said two parallel surfaces and corresponding to the arrangement of a plurality of ball bumps of a BGA package such that tips of said contact pins protrude from one of said two parallel surfaces;
   a flat guide plate having a plurality of holes which matches the arrangement and shape of said plurality of ball bumps, elastically supported so as to be in a floating state with respect to said surface through which protrude said plurality of contact pins, and housing a tip of one of said plurality of contact pins in each of said holes;
   the rims of the openings of each of said holes being a tapered form so as to guide the center of each of said ball bumps to within the limits of the outer form of the tips of each of said contact pins;
   flat tabs arranged on mutually opposing sides of said guide plate;
   springs pushing up each of said tabs such that each tab is in a floating state with respect to said socket body; and
   screws passing through said tabs and screwed into said socket body, using the head of said screws for restraining said tabs at a prescribed height.

2. An IC socket for a BGA package comprising:
   a socket body having at least two mutually opposing parallel surfaces;
   a plurality of contact pins embedded in said socket body perpendicular to said two parallel surfaces and corresponding to the arrangement of a plurality of ball bumps of a BGA package, such that the tips of said contact pins protrude from one of said two parallel surfaces; and
   a flat guide plate having one hole matching an outline delineated by the outer side surfaces of the outermost ball bumps of said plurality of ball bumps, elastically supported so as to be in a floating state with respect to said surface through which protrude said plurality of contact pins, and housing the tips of said plurality of contact pins in said hole;
   the rims of the openings of said hole being a tapered form so as to guide the center of each of said ball bumps to within the limits of the outer form of the tips of each of said contact pins.

3. An IC socket for a BGA package comprising:
   a socket body having at least two mutually opposing parallel surfaces;
   a plurality of contact pins embedded in said socket body perpendicular to said two parallel surfaces and corresponding to the arrangement of a plurality of ball bumps of a BGA package, such that the tips of said contact pins protrude from one of said two parallel surfaces;
   a flat guide plate having one hole matching an outline delineated by the outer side surfaces of the outermost ball bumps of said plurality of ball bumps, elastically supported so as to be in a floating state with respect to said surface through which protrude said plurality of contact pins, and housing the tips of said plurality of contact pins in said hole;
   the rims of the openings of said hole being a tapered form so as to guide the center of each of said ball bumps to within the limits of the outer form of the tips of each of said contact pins;
   flat tabs arranged on mutually opposing sides of said guide plate;
   springs pushing up each of said tabs such that each tab is in a floating state with respect to said socket body; and
   screws passing through said tabs and screwed into said socket body, using the head of said screws for restraining said tabs at a prescribed height.

* * * * *